(12) United States Patent
Tripsas et al.

(10) Patent No.: US 6,211,020 B1
(45) Date of Patent: Apr. 3, 2001

(54) PROCESS FOR FABRICATING A COMMON SOURCE REGION IN MEMORY DEVICES

(75) Inventors: Nicholas Harris Tripsas, San Jose; Mark T. Ramsbey, Sunnyvale, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/177,294

(22) Filed: Oct. 22, 1998

(51) Int. Cl.$^7$ ................................................. H01L 21/336
(52) U.S. Cl. ............................................ 438/294; 438/513
(58) Field of Search ........................... 438/294, 513–514; 257/315

(56) References Cited

U.S. PATENT DOCUMENTS

| | | | |
|---|---|---|---|
| 4,698,787 | * 10/1987 | Mukherjee et al. | 365/185 |
| 4,861,729 | * 8/1989 | Fuse et al. | 438/513 |
| 5,120,671 | * 6/1992 | Tang et al. | 438/294 |
| 5,470,773 | * 11/1995 | Liu et al. | 438/294 |
| 5,918,141 | * 6/1999 | Merrill | 438/514 |

OTHER PUBLICATIONS

Yu et al Conformal Doping of High aspect Ratio Techniques By Plasma Immersion Ion Implantation Plasma assisted processing laboratory university of california, berkley, 1991.*

Samachisa et al A 128K Flash EEPROM using Double–Polysilicon Technology IEEE journal of solid state circuits, 1987.*

Samachisa, et al., "A 128K Flash EEPROM Using Double Polysilicon Technology," IEEE Journal of Solid State Circuitry, vol. SC–22, No. 5, Oct. 1987, pp. 676–683.

Yu, et al., "Conformal Doping of High Aspect Ratio Techniques by Plasma Immersion Ion Implantation (PIII)," Plasma Assisted Materials Processing Laboratory, Department of Electrical Engineering and Computer Sciences, University of California, Berkeley, CA 94720.

* cited by examiner

Primary Examiner—Charles Bowers
Assistant Examiner—David S Blum
(74) Attorney, Agent, or Firm—Fliesler Dubb Meyer & Lovejoy LLP (57) ABSTRACT

A method for manufacturing a non-volatile memory device includes forming a memory device on the semiconductor substrate by forming isolation regions in said substrate, forming gate stacks on the substrate between respective ones of said isolation regions, with each stack having at least an active region adjacent thereto, and forming common source regions for the plurality of gate stacks through a plasma implant of an impurity.

A memory device having a plurality of memory transistors is also provided. The device generally comprises a semiconductor substrate having a generally planar surface. Field oxide regions are formed in the semiconductor substrate to a depth below the substrate surface. The common bus region is provided which is exposed to the substrate, the common bus region including at least a first recessed portion of the substrate wherein areas of the field oxide regions have been removed so that said recessed portion has a depth below the surface of the substrate. An impurity region forming the common bus is formed in the common bus region, with the impurity region having a junction depth which is generally uniform within the recessed portion.

10 Claims, 10 Drawing Sheets

PROCESS FOR FABRICATING A COMMON SOURCE REGION IN MEMORY DEVICES

BACKGROUND OF THE INVENTION

1. Field of the Invention

This invention relates generally to semiconductor devices and process for fabricating the same and, particularly to a process for fabricating a flash EPROM or EEPROM memory device.

2. Description of the Related Art

Non-volatile memory devices, and particularly so-called "flash" memory devices, have become increasingly more popular in data storage applications. The term EPROM is an acronym for Erasable Programmable Read Only Memory, while EEPROM refers to Electrically Erasable PROMs. The term "flash" in conjunction with electrical erasable programmable read only memory or "flash EEPROMS", generally refers to EEPROM memory cells which are programmed by hot electron injection and erased by Fowler-Nordheim tunneling. The operation and structure of such devices is discussed in U.S. Pat. No. 4,698,787, issued Oct. 6, 1987, to Mukherjee et al., and IEEE Journal of Solid State Circuitry, Vol. SC-22, No. 5, October, 1987, pages 676–683 in an article entitled, "A 128K Flash EEPROM Using Double Polysilicon Technology" by Gheorghe Samachisa, et al.

Figure 1:
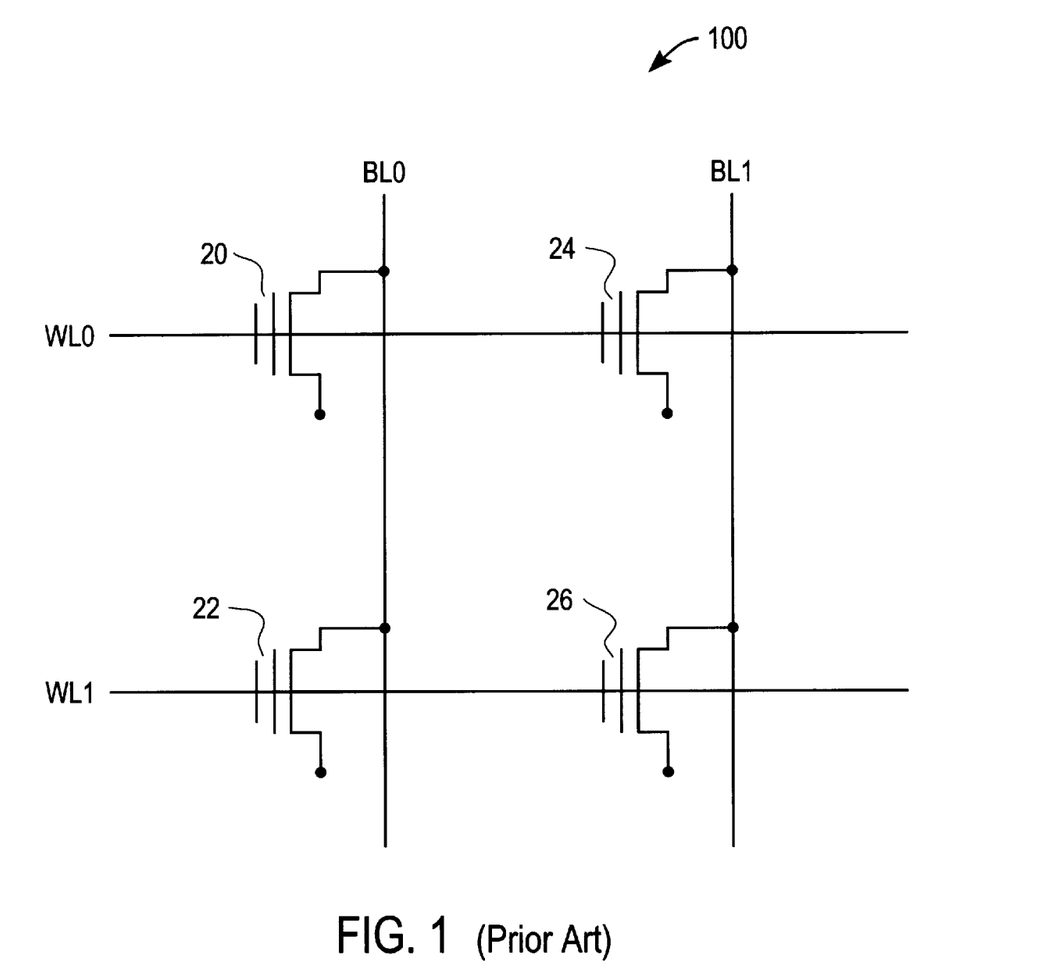
FIG. 1 depicts a partial schematic view of a conventional EEPROM memory array.

Generally, an array of flash EPROM or EEPROM memory cells may be formed on a semiconductor substrate in a series of rows and columns, accessed by conductors referred to as word lines and bit lines. These memory cells are formed in the "core" area of the cell, with control transistors lying in the device's "periphery" region. A portion of an array is illustrated schematically in FIG. 1. In FIG. 1, a two-by-two matrix of memory cells 100 is shown with a first memory cell 20 having its drain connected to bit line 0 (BL0), its control gate coupled to word line 0 (WL0) and its source floating. Also shown in FIG. 1 is a second memory cell 22 also having its drain connected to BL0, its control gate coupled to word line 1 (WL1) and its source floating. As illustrated in FIG. 1, the sources of the memory cells 20, 22, 24 and 26 are shown to be floating; however, the sources can be connected to form a common source line.

Each memory cell is formed in the semiconductor substrate by, for example, diffusion of an N+ drain region, and an N-type, double diffused source region, with a channel region positioned between the drain and source regions. The double diffused source region is formed of a deeply diffused, but lightly doped N-type region, commonly doped with phosphorous (known as a double diffused junction (DDJ)), and a more heavily doped but more shallowly diffused N+ region, commonly doped with arsenic (As) within the DDJ. A tunnel oxide is formed on the silicon substrate separating a floating gate from the source and drain regions, and a control gate is formed over the floating gate, separated therefrom by an inter-polysilicon dielectric layer.

Figure 2:
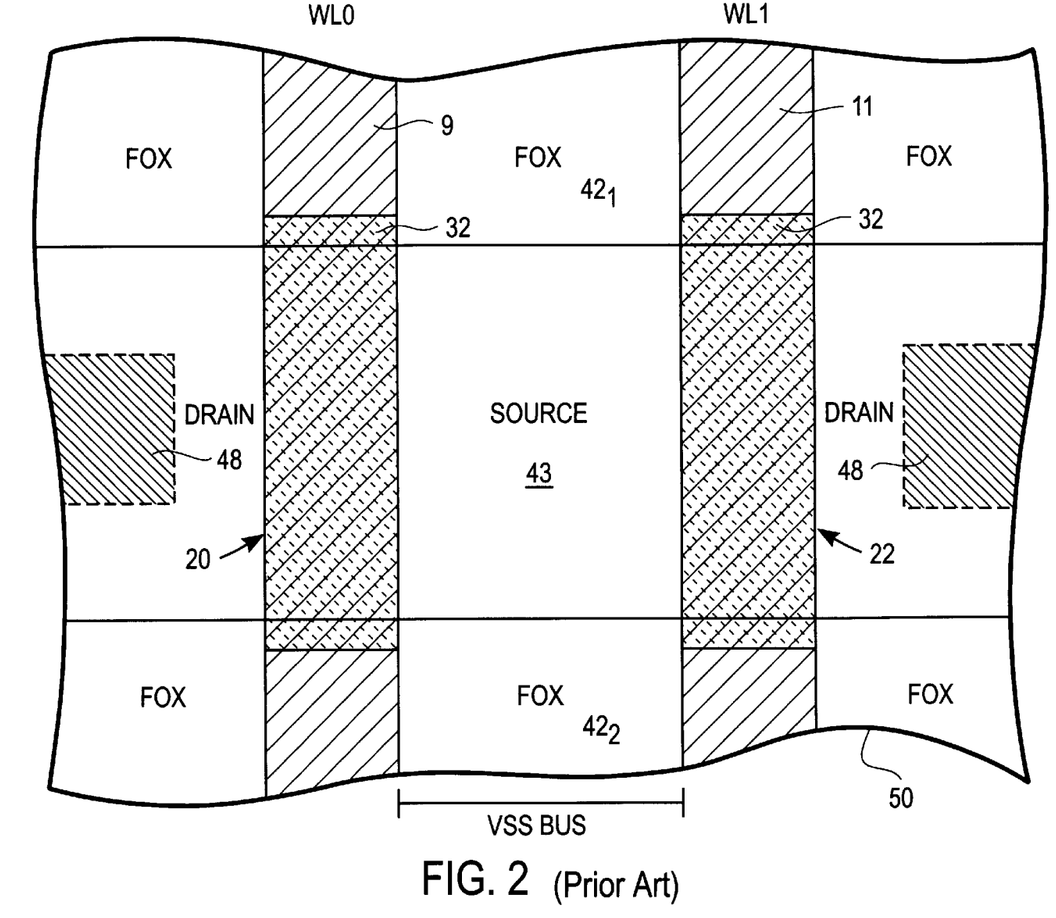
FIG. 2 illustrates a partial top view of a flash memory array formed on a semiconductor substrate.

FIG. 2 illustrates a top view of a portion of a semiconductor substrate under fabrication as a flash cell, such as that shown schematically in FIG. 1. Shown in FIG. 2 are two unit cells 20,22, formed by a second polysilicon gate layer or control gate layer (defining wordline $\phi$ (WL$\phi$)) deposited on top of an interdielectric layer 30 (shown in FIG. 5) such as oxide-nitride-oxide sandwich, and a first polysilicon gate layer or floating gate layer 29. Field oxide regions 42 formed by, for example, a LOCOS process, separate and isolate adjacent memory devices along a word line. A common source region 43 is used for adjacent cells and is formed by a self-aligned source mask and etch, as discussed below. Metal layers 48 or another conductor material used to couple the cells are omitted for clarity.

One conventional method of manufacturing a flash EPROM or EEPROM array includes a number of separate masking steps between the point in time when polysilicon layers (or "poly stack") which will form control gate and floating gate regions are deposited onto a substrate, and the steps of formation of the core memory devices. (It should be recognized that complete processing of the integrated circuit requires a substantial number of processing steps which are not detailed here in order not to unduly obscure the nature of the present invention. Such processing steps would be within the knowledge and skill of one of average skill in the art.)

In forming flash devices, the source side of the core memory cells can be connected by a common $V_{ss}$ buss. The use of such a bus saves die size by allowing designers to have many transistors share a common contact. The resistance of the $V_{ss}$ bus determines the number of transistors per contact, i.e., the size and overall performance of the part.

Typically, this bus is formed in a process known as the SAS. In this process, during formation of the integrated circuit device, the field oxide separating the source regions of a number of cells are removed and an implant made into the substrate with an impurity of the same type as formed the source regions to couple the source regions together to form the $V_{ss}$ bus.

Typically, the core region in which the memory cells are formed comprises an P-type region, and the source region an N-type implant regions, so that the implant for the self aligned source regions is generally performed by a zero degree arsenic implant.

One drawback of this method is that the Vss bus is pinched off in the area where the etched region steps up to the active regions.

SUMMARY OF THE INVENTION

The invention generally comprises a method for manufacturing a non-volatile memory device. In one aspect, the method includes forming a memory device on the semiconductor substrate by forming isolation regions in said substrate, forming gate stacks on the substrate between respective ones of said isolation regions, with each stack having at least an active region adjacent thereto, and forming common source regions for the plurality of gate stacks through a plasma implant of an impurity.

In a second aspect, a memory device having a plurality of memory transistors is provided. The device generally comprises a semiconductor substrate having a generally planar surface. Field oxide regions are formed in the semiconductor substrate to a depth below the substrate surface. The common bus region is provided which is exposed to the substrate, the common bus region including at least a first recessed portion of the substrate wherein areas of the field oxide regions have been removed so that said recessed portion has a depth below the surface of the substrate. An impurity region forming the common bus is formed in the common bus region, with the impurity region having a junction depth which is generally uniform within the recessed portion.

BRIEF DESCRIPTION OF THE DRAWINGS

These and other advantages and features of the present invention will become apparent from the following description of the preferred embodiment, taken in conjunction with the accompanying drawings, where like numerals represent like elements, in which.

DETAILED DESCRIPTION OF THE EMBODIMENTS

An improved manufacturing process for forming flash EEPROM devices is hereinafter disclosed. In the following description, numerous details, for example, specific materials, process steps, etc., are set forth in order to provide a thorough understanding of the present invention. It will be obvious, however, to one skilled in the art that the specific details need not be employed to practice the present invention.

One portion of a conventional process flow which may be used for forming a memory array is illustrated in FIGS. 3–12. FIG. 11 represents a flow chart of one exemplary process flow of the present invention. In FIGS. 4–8 and 12–15, each figure represents cross-sections of the core area of a non-volatile memory cell. It should be understood by those skilled in the art that other processing steps occur at various stages of the formation of the device, on periphery areas of the device. All such process steps are not illustrated herein in order to not unduly obscure the invention.

Figure 3:
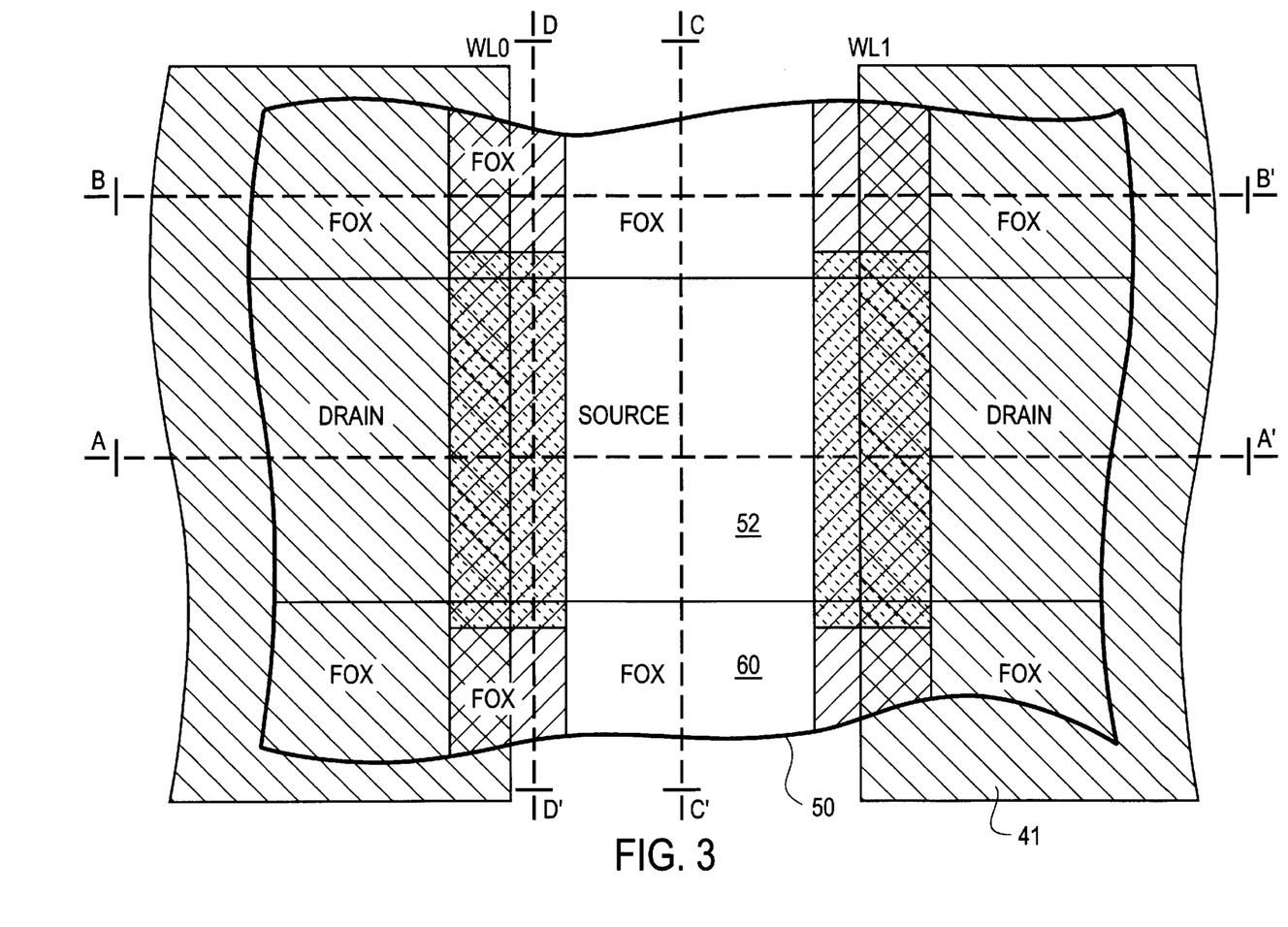
FIG. 3 is a partial, top view of a flash memory array with the SAS etch mask in place.

FIG. 3 shows a partial top view of a flash memory array with the Self Aligned Source (SAS) etch mask in place and will be useful as a reference for the different cross-sectional views presented in subsequent figures.

Figure 4:
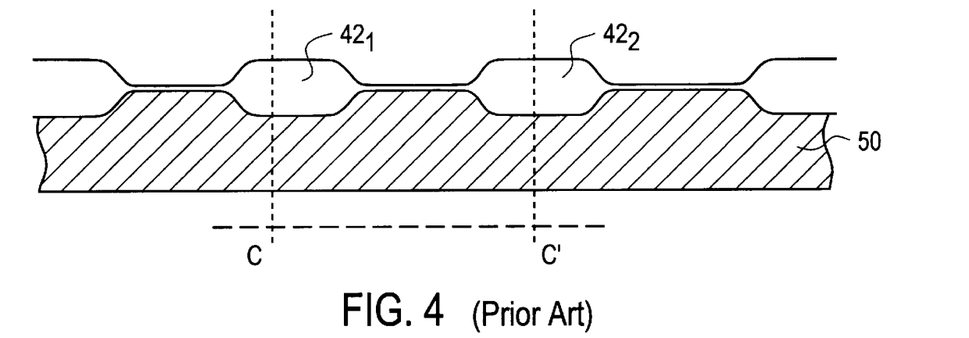
FIGS. 4 and 5 illustrate cross-sections of a core region of a memory device formed in accordance with conventional processing techniques.

FIG. 4 shows an expanded cross-section of wafer substrate 50 along line C—C' (FIG. 3) having formed on it lateral isolation by, for example, a local oxidation of silicon (LOCOS) process growing select portions of a field oxide 42 to result in field oxide regions $42_1$–$42_2$. It should be recognized that other methods of device isolation, such as trench isolation, may also be used without departing from the spirit of the invention.

Figure 5:
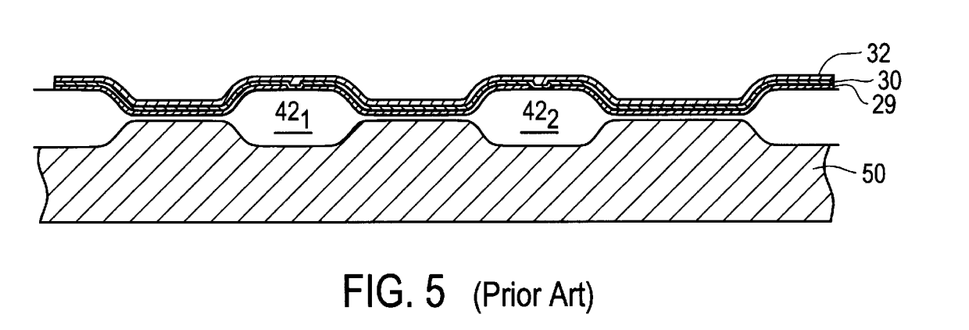

Shown in FIG. 5 is an extended cross-sectional view along line D—D' in FIG. 3. After formation of the field oxide regions, $42_1$–$42_2$, conventional polysilicon layer deposition and masking techniques will result in the provision of a first polysilicon layer 29 and an inter-polysilicon dielectric layer 30, overlying the core region of the array. A second polysilicon layer 32 is simultaneously deposited in both the core region and periphery region (not shown) of substrate 50. It should be recognized that polysilicon layers 29 and 32 may also be comprised of a polysilicide. As described below, the first polysilicon layer 29, inter-poly dielectric layer 30, and second polysilicon layer 32 will be used to form memory cell gate stacks and the word lines for the cell structure shown in FIGS. 1 and 2.

Figure 6:
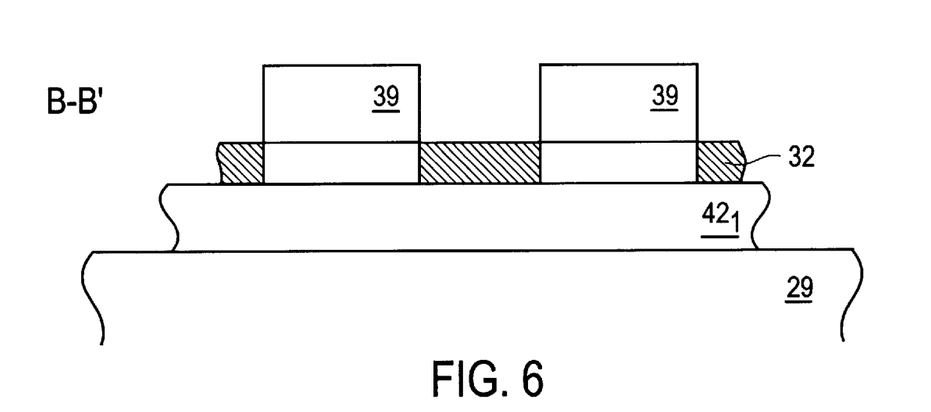
FIGS. 6, 7 and 8 illustrate cross-sections of a core region of a memory device along lines B—B' in FIG. 3.
Figure 7:
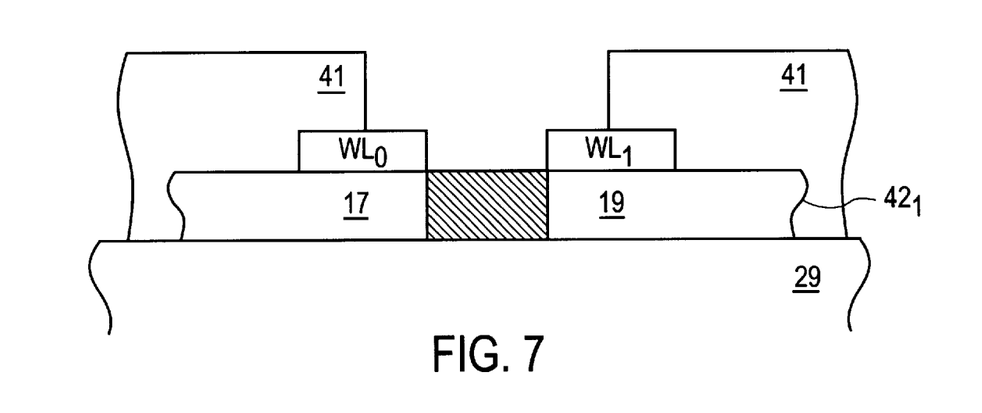
Figure 8:
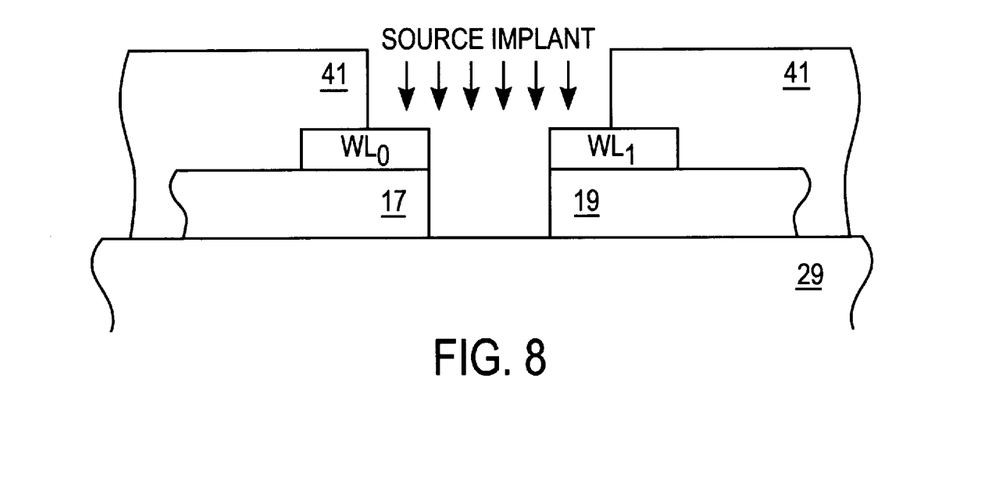

The formation and resulting alignment of field oxide regions $42_1$,$42_2$ with poly word lines $WL_0$ and $WL_1$ is shown in side views in FIGS. 6–8. Note that FIGS. 6–8 represent a cross-sectional view of FIG. 3 along line B—B' (perpendicular to the view of FIGS. 4 and 5) and shows as continuous the thick portion $42_1$, of field oxide layer 42 underlying poly layer word lines $WL_0$, and $WL_1$.

Referring now to FIG. 6, a photoresist mask 39 is formed on the polysilicon 32 and patterned to leave select portions of the polysilicon 32 exposed. Note that conventional photoresist development techniques may be used as well as a direct write technique, such as for example an electron beam or a laser beam, to create the mask pattern in the photoresist.

Etching the exposed portions of polysilicon 32 through the photoresist mask 39 of FIG. 6 yields the formation, as shown in FIG. 7, where the only remaining polysilicon is that which was protected by the opaque portions of photoresist mask 39. The remaining polysilicon portions form poly word lines $WL_0$ and $WL_1$.

Forming poly word lines $WL_0$ and $WL_1$ by etching the exposed polysilicon through the mask 39 exposes portions of the underlying field oxide $42_1$. In one embodiment, mask 41 is then placed on the device to protect the drain regions and the field oxide portions are subsequently etched using a high selectivity oxide etch. As shown in FIG. 8, the selective oxide etching of field oxide $42_1$, yields field oxide portions 17 and 19.

Figure 9:
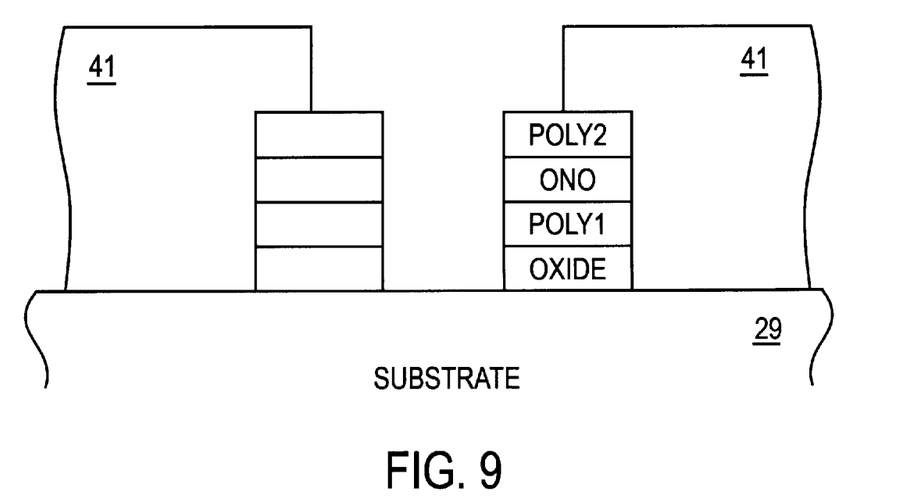
FIG. 9 is a cross-section of the core area along line A—A' in FIG. 3 of a wafer substrate illustrating the source region.

FIG. 9 shows a cross section of the active cell region (along line A—A' in FIG. 3) at the same point in the process—following the aforementioned selective oxide etch and prior to the source implant. Note that the aforementioned processing has produced the well-recognized "stacked gates" 9, 11 for memory cells 20, 22. In one process useful in accordance with the present invention, the source implant is now performed along with a drain implant.

Figure 10:
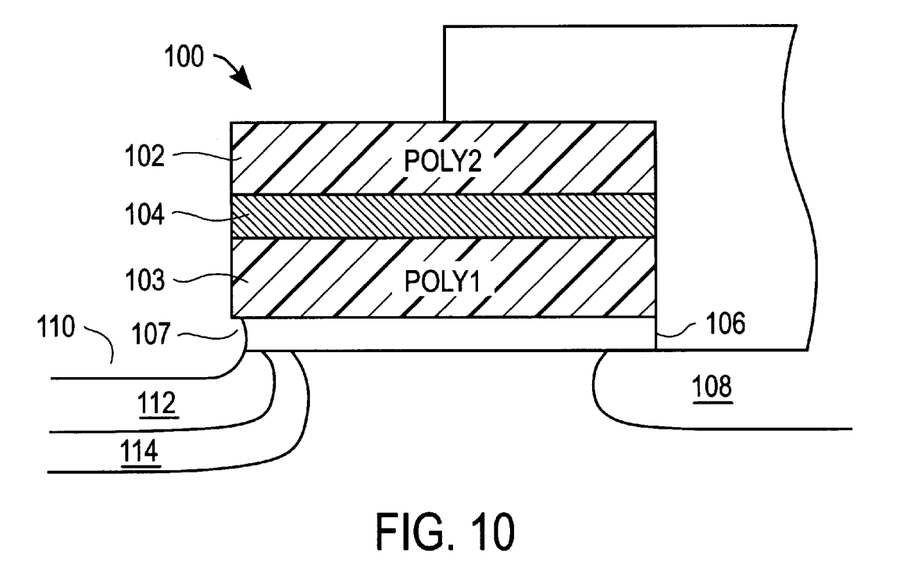
FIG. 10 is a cross-section of the core area along line A—A' in FIG. 3 of a wafer substrate illustrating formation of the core N+ implant.

FIG. 10 shows an enlarged cutaway diagram of a flash EPROM cell 100 which has been processed in accordance with the first embodiment of the method of the invention and has been provided with the subsequent source and drain implant. Note that FIG. 10 can be thought of as the right half of FIG. 9 with source and drain implants performed after the SAS oxide etch. This cell 100 comprises first and second polysilicon layers 102 and 103 and inter-poly dielectric region 104 therebetween, and a tunnel oxide region 106 between the first poly silicon layer 103 and the silicon area 108.

Figure 14:
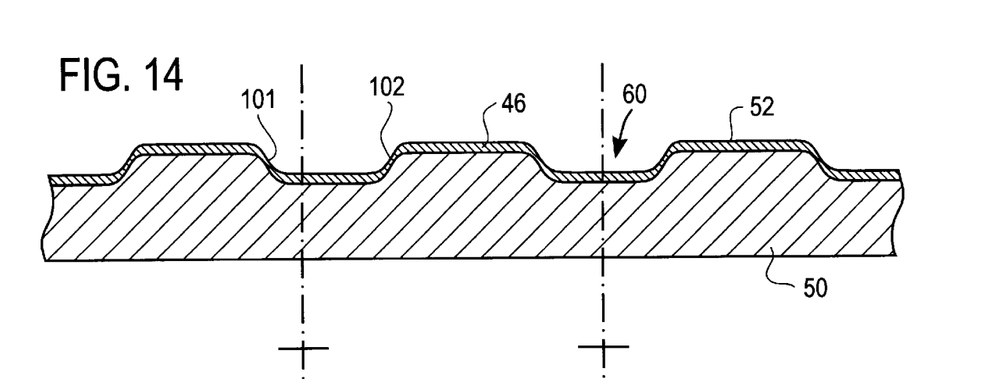
FIGS. 14 and 15 are cross-sections along line C—C' in FIG. 3 illustrating the resulting implanted $V_{ss}$ bus structure in a conventional process and in the process of the present invention.

Typically, this source implant will comprise a zero degree ion implant to form the common source region, resulting in the structure shown in cross-section in FIG. 14.

Figure 11A:
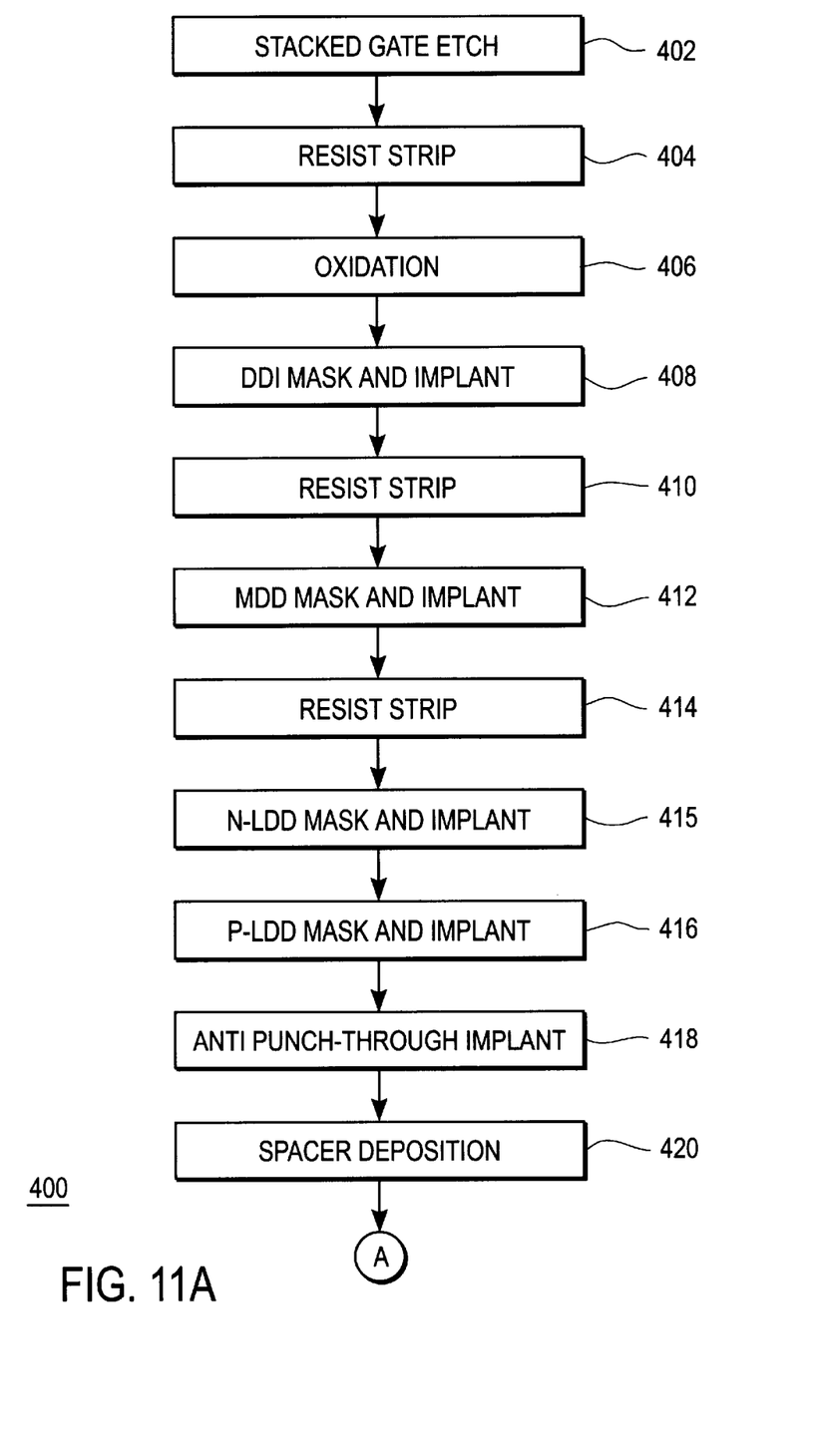
FIGS. 11A–11B are flow charts illustrating one aspect of the present invention.
Figure 11B:
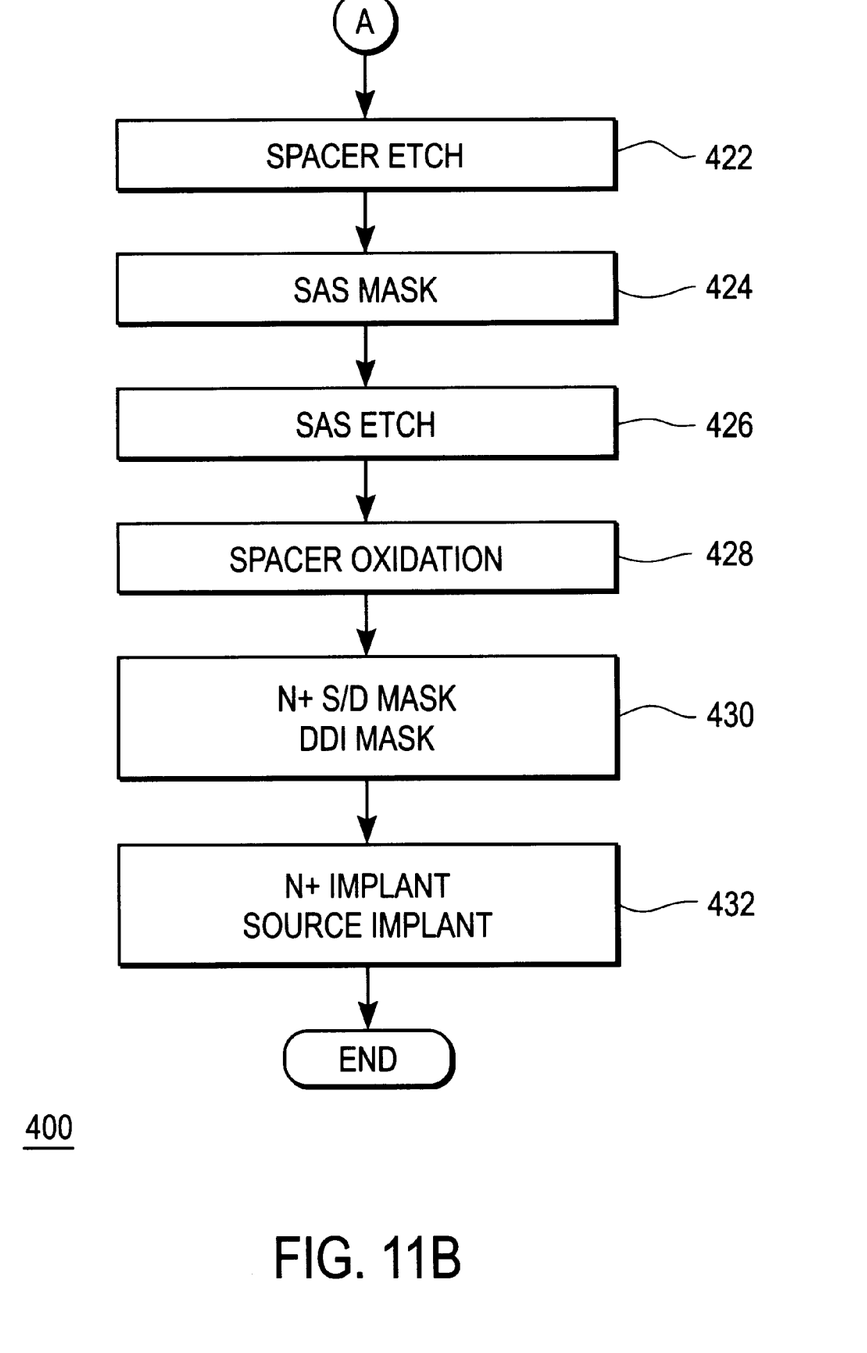
Figure 12:
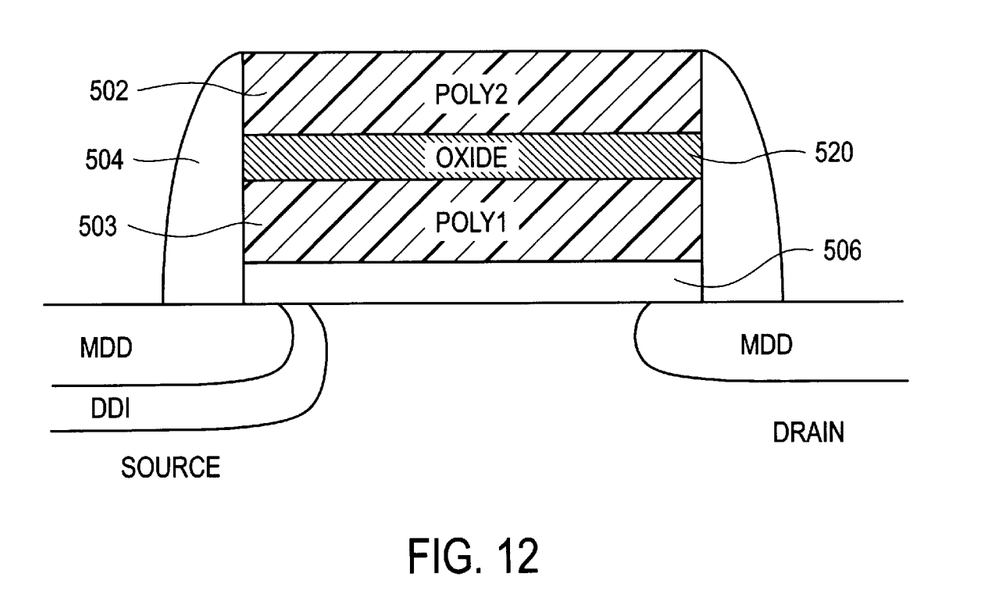
FIG. 12 is a cross-section of the gate stack along line A—A' in FIG. 3 illustrating the structure prior to the SAS etch.

Referring now to FIGS. 11A and 11B, what is shown is a flow chart of a second embodiment of a method for forming a device in accordance with the present invention. First, the stacked gate etch takes place, via step 402. Then the resist strip takes place, via step 404. Next a thin oxide or oxidation for implant screen is provided via step 406.

Thereafter, the double diffused implant (DDI) mask and DDI implant takes place, via step 408 and another resist strip takes place, via step 410. Thereafter the modified drain diffusion (MDD) mask and implant takes place via step 412 and another resist strip takes place, via step 413. Thereafter for the periphery transistor an N-lightly doped drain (LDD) mask and implant and a P-LDD implant mask and implant is provided, via steps 415 and 416 and an antipunch through (AT) implant is provided, via step 418.

Then a spacer deposition is provided via step 420. Finally, the spacer is etched, via step 422 for spacer formation. This spacer could be comprised of various types of material. At this point, the cross section of the core cell 400 looks like that shown in FIG. 12. Accordingly, the stacked gate edge 502 and the tunnel oxide 506 are protected by the spacer formation 504.

Thereafter the process for providing SAS etch can then occur. Referring back to FIG. 11B, an SAS mask is provided, via step 424. Then the SAS etch can be provided, via step 426. Thereafter the post-spacer etch oxidation takes place, via step 428. Then the N+ S/D (source/drain) mask and DDI mask (a critical mask) are provided, via step 430. Finally, the N+ S/D implant and a source implant are provided via step 432. In one embodiment, implant step 432 may be used to connect the source line from the actual source region and field region that is SAS etched in conventional process. Since the MDD implant is done after the SAS etch, the $V_{ss}$ line is automatically connected. Alternatively, if the MDD implant is done before the SAS, an additional implant is needed to connect field oxide region and active region of the source line. But this additional implant can be obtained without an extra processing step by using the N+ S/D implant.

Figure 13:
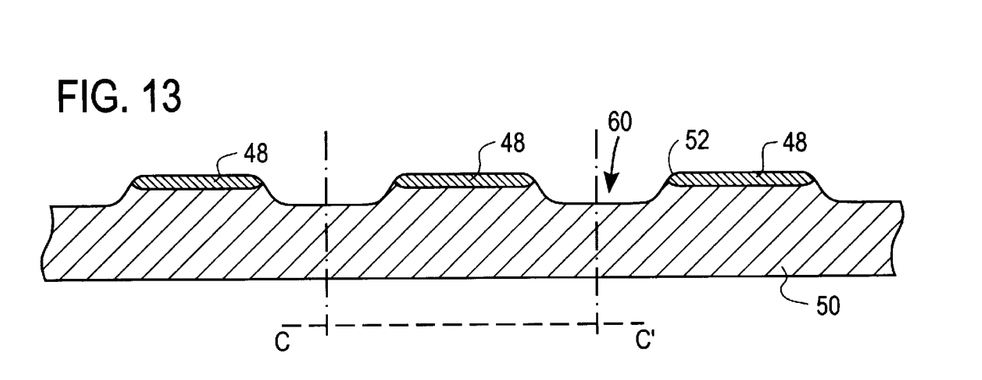
FIG. 13 is a cross-section along line C—C' in FIG. 3 illustrating implant regions formed in the substrate.

FIG. 13 shows an extended cross-sectional view of the substrate prior to the source connection implant along line C—C' in FIG. 3. As shown thereon, the source region is imparted into the surface 52 of substrate 50. Recessed regions 60 will be implanted following the SAS etch step.

The result of the source implant, forming the $V_{ss}$ bus in source region 43, is shown in FIG. 14.

Typically, step 432 comprises implanting an N+ impurity via a conventional, zero degree ion implant, into the substrate to form an N+ impurity region and a plurality of drain impurity regions.

FIG. 14 shows the effect of the source connection implant along the cross-section of the source (line C—C in FIG. 3). As shown therein, at areas 101 and 102, these sections of the $V_{ss}$ bus are pinched, having shallower junction depths than the other implanted areas of the $V_{ss}$ bus. These areas consequently have high resistance and therefore deleteriously affect the number of transistors per contact and the performance of the part.

Figure 15:
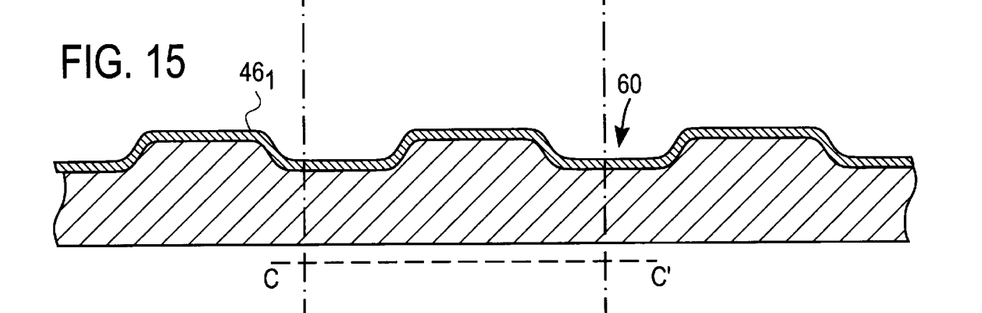

In accordance with the present invention, a novel process for forming the $V_{ss}$ bus is used following the standard gate etch in the first embodiment of the process or at step 432 in the second embodiment. Replacing the conventional zero degree implant step to form the $V_{ss}$ bus is a plasma doping process. In accordance with the invention, a process similar to that shown in Yu, et al., "Conformal Doping of High Aspect Ratio Techniques by Plasma Immersion Ion Implantation (PIII), Plasma Assisted Materials Processing Laboratory, Department of Electrical Engineering and Computer Sciences, University of California, Berkeley, wherein an $A_sH_3$ plasma is carried out on substrate 50 to provide a drive-in of the SAS implant for the $V_{ss}$ bus which will result in a conformal implant 46$_1$, as shown in FIG. 15. A typical implant might be using the plasma of arsenic or phosphorous with substrate biases of 5–30 Kv to achieve a dose of $5 \times 10^{14} - 5 \times 10^{15}$ of an arsenic impurity. An additional dopant drive-in step may be utilized if necessary.

A further unique feature of the invention is that a trench isolation may be used in place of the standard LOCOS isolation. Because plasma doping allows for doping of sidewalls with extremely high aspect ratios (e.g. up to twelve as in the aforementioned Yu, et al. paper), trench isolation may be utilized to further conserve space and increase the density of devices per substrate which may be utilized.

After implantation of the N+ impurity regions, the core N+ implant mask is stripped, and processing on the core side of the array is essentially completed. Processing of the integrated circuit to form other devices and structures necessary for the memory may proceed in accordance with well-known techniques.

The many features and advantages of the present invention will be readily apparent to one of average skill in the art. Obvious modifications of the process will also be readily apparent to one of average skill. All such features, advantages and modifications considered as being within the scope of the invention are specified herein and defined in the following claims.

What is claimed is:

1. A method for forming a memory device on a semiconductor substrate, comprising:
   (a) forming isolation regions in said substrate;
   (b) forming gate stacks on the substrate between respective ones of said isolation regions, each stack having at least an active region adjacent thereto; and
   (c) forming a common source region for said plurality of gate stacks through a process of plasma immersion ion implantation.

2. The method of claim 1 wherein said step (c) comprises the sub-steps of:
   (1) removing a portion of said plurality of isolation regions to form a region of exposed substrate area for said common source region;
   (2) said region of said substrate including at least a recessed portion of the substrate wherein areas of said isolation regions have been removed.

3. The method of claim 1 wherein said step (a) comprises forming LOCOS oxide regions.

4. The method of claim 1 wherein said step (a) comprises forming trench oxide regions.

5. The method of claim 1 wherein said step (c) comprises generating a plasma with a substrate bias of 5 to 30 KeV.

6. A method for manufacturing a memory device on a substrate, the device having a core region for memory cells, and a periphery region for active devices, the device including field oxide regions overlying a common source junction in said core region, comprising:
   (a) forming gate structures in the core region between respective ones of the field oxide regions;

(b) removing portions of said field oxide regions to expose a common portion of the substrate adjacent to at least a subset of said gate structures; and (c) implanting an impurity into the common portion of the substrate adjacent to the gate structures, by a process of plasma immersion ion implantation, to form a common bus.

7. The method of claim 6 wherein said step (b) comprises the sub-steps of:

(1) removing a portion of said plurality of isolation regions to form a region of exposed substrate area for said common bus region, said region of said substrate including at least a recessed portion of the substrate wherein areas of said field oxide regions have been removed.

8. The method of claim 6 wherein said field oxide regions comprise LOCOS oxide regions.

9. The method of claim 6 wherein said field oxide regions comprise trench oxide regions.

10. The method of claim 6 wherein said step (c) comprises generating a plasma with a substrate bias of 5 to 30 KeV.

\* \* \* \* \*